US012603669B2

(12) United States Patent
Shen et al.

(10) Patent No.: US 12,603,669 B2
(45) Date of Patent: Apr. 14, 2026

(54) CALIBRATION TECHNIQUES FOR ALTERNATING-CURRENT (AC)-COUPLED TRANSCEIVER

(71) Applicant: NVIDIA Corporation, Santa Clara, CA (US)

(72) Inventors: Chun-Ju Shen, Los Altos, CA (US); Ying Wei, San Jose, CA (US); Vishnu Balan, Saratoga, CA (US); Haiming Tang, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 31 days.

(21) Appl. No.: 18/765,602

(22) Filed: Jul. 8, 2024

(65) Prior Publication Data

US 2026/0012216 A1     Jan. 8, 2026

(51) Int. Cl.
H04B 1/16          (2006.01)
H03F 3/45          (2006.01)
(52) U.S. Cl.
CPC ........... H04B 1/16 (2013.01); H03F 3/45475 (2013.01)
(58) Field of Classification Search
CPC .............................. H04B 1/16; H03F 3/45475
See application file for complete search history.

(56) References Cited

U.S. PATENT DOCUMENTS

| | | | |
|---|---|---|---|
| 2017/0153279 A1* | 6/2017 | Chung ..................... | H03F 3/04 |
| 2018/0091231 A1* | 3/2018 | Rodriguez-Perez ......................... | |
| | | | H03F 3/45475 |
| 2025/0266797 A1* | 8/2025 | Li ....................... | H03F 3/45744 |

FOREIGN PATENT DOCUMENTS

WO      WO-2025133212 A1 *  6/2025   ............... H03G 3/30

OTHER PUBLICATIONS

Machine translation of CN-114268378-A (Year: 2022).*
Machine translation of WO-2022071000-A1 (Year: 2022).*

* cited by examiner

*Primary Examiner* — Jean B Corrielus
(74) *Attorney, Agent, or Firm* — Lowenstein Sandler LLP

(57)          ABSTRACT

A circuit includes a receiver coupled to an input node and includes a transimpedance amplifier (TIA). The input node is to be coupled to a transmitter over a channel. Calibration circuitry is coupled to the input node and to modify a resistance of a feedback resistor of the receiver by applying a plurality of control values. The calibration circuitry is to generate, for each applied control value, a first digital code for a direct current (DC) swing and a second digital code for an alternating current (AC) swing at the input node. The calibration circuitry is to determine a final control value of the plurality of control values that minimizes a difference between the first and second digital codes.

27 Claims, 9 Drawing Sheets

200B

200A

CALIBRATION TECHNIQUES FOR ALTERNATING-CURRENT (AC)-COUPLED TRANSCEIVER

TECHNICAL FIELD

At least one embodiment generally pertains to communications systems, and more specifically, but not exclusively, to calibration techniques for alternating current (AC)-coupled transceiver.

BACKGROUND

In some communication systems or communications devices, AC-coupled transceivers are employed to reduce power of data transmission by reducing the AC voltage swing. These AC-coupled transceivers, however, can suffer from a mismatch between direct-current (DC) and AC voltage swings, as well as duty cycle, across process, voltage, temperature (PVT) changes on silicon-based chips. For example, the mismatch between DC and AC voltage swings can cause inter-symbol interference (ISI) in the AC-coupled transceiver.

BRIEF DESCRIPTION OF DRAWINGS

Various embodiments in accordance with the present disclosure will be described with reference to the drawings, in which.

DETAILED DESCRIPTION

Figure 1A:
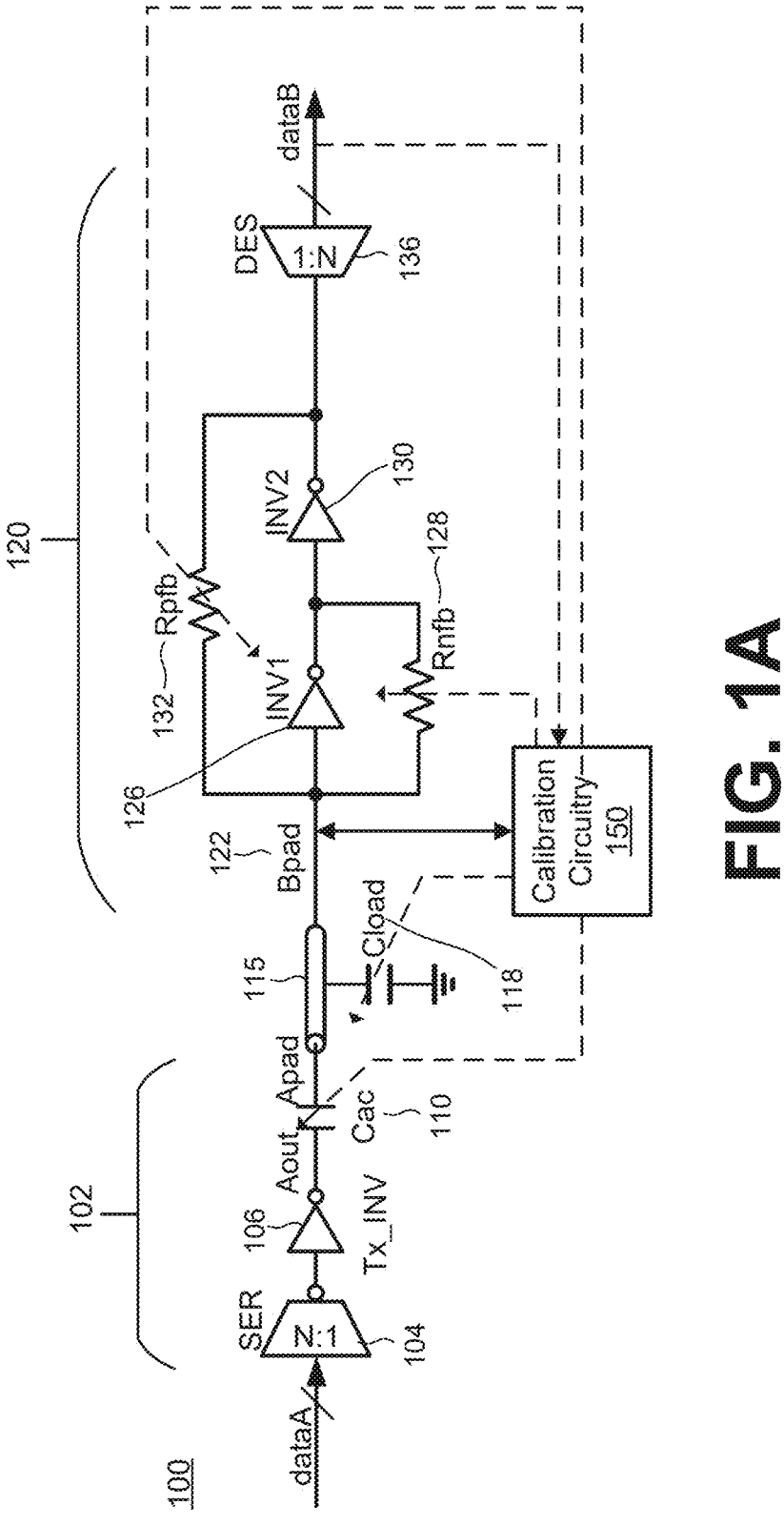
FIG. 1A is a schematic block diagram of an example system composed of an AC-coupled transceiver employing calibration circuitry to reduce the mismatch between DC and AC voltage swings and calibrate duty cycle according to various embodiments.

In some implementations of the circuits, devices, systems, and methods described herein are calibration techniques for an AC-coupled transceiver, particularly with a focus on reducing the mismatch between AC and DC voltage swings across the AC-coupled transceiver. In some implementations of the above-described circuitry, the Rx side of the AC-coupled transceiver is designed around a transimpedance amplifier (TIA)-based architecture. The Rx side is designed to amplify an AC component from the transmitter (Tx) while recovering a DC component, which is blocked by the AC-coupled capacitor. As previously discussed, the AC and DC component swings, as well as duty cycle, between the Tx and Rx sides of the AC-coupled transceiver (e.g., after signals have passed through a channel between the Rx and Tx) can cause inter-symbol interference (ISI), which is unwanted particularly in high-speed applications. For example, when the DC voltage swing sufficiently mismatches the AC voltage swing (or a minimum DC voltage sufficiently mismatches a minimum AC voltage) of a signal at an input node to the Rx side (e.g., after exiting the channel), the signal takes longer to resettle, during which time the ISI occurs. Some existing solutions, related to addressing baseline wandering, are insufficient in being overly complicated, taking up too much silicon area, and consuming too much power.

Aspects and embodiments of the present disclosure address the above deficiencies and others in an AC-coupled transceiver design, by employing calibration circuitry that includes a peak detector to identify either a minimum voltage (Vmin) or a maximum voltage (Vmax) of the DC voltage and the envelope of the AC voltage, comparing the DC and AC swings, and adjusting certain parameters of components of the TIA-based design to reduce the mismatch between the DC and AC swings. More specifically, the present TIA-based design includes both a positive feedback resistor and a negative feedback resistor as well as an AC-coupled capacitor (at the Tx) and a capacitive load associated with a channel between the Tx and Rx sides.

In various embodiments, the calibration circuitry variably modifies the resistance of one of the resistors or capacitance of one of the capacitors using a plurality of control values and generates updated digital codes, e.g., using an analog-to-digital converter (ADC) coupled to the peak detector, for the DC swing and the AC swing at the input node of the Rx. For example, for each control value, the ADC can generate a first digital code for the DC swing and a second digital code for the AC swing at the input node. A final control value may then be determined that minimizes a difference between the first and second digital codes across the plurality of control values. In some embodiments, the capacitance of a particular channel may be modified by variably controlling a capacitor coupled to the channel to the Tx side and ground. In at least some embodiments, the calibration circuitry also performs duty cycle calibration to fine-tune the input common mode (e.g., Vmid) and minimize an input offset associated with a command mode voltage of the AC-coupled transceiver.

Therefore, advantages of the circuits, devices, systems, and methods implemented in accordance with some embodiments of the present disclosure include, but are not limited to, minimizing the mismatch between the DC swing and the AC swing through the channel of a TIA-based AC-coupled transceiver. Further, calibration circuitry and methods can be employed to also calibrate the duty cycle or common mode voltage. Other advantages will be apparent to those skilled in the art of AC-coupled transceivers, as will be discussed hereinafter.

FIG. 1A is a schematic block diagram of an example system (to include devices and/or circuits) composed of an AC-coupled transceiver 100, which employs calibration circuitry to reduce the mismatch between DC and AC voltage swings and calibrate duty cycle. While the present embodiments are especially targeted for short-reach, die-to-die communication over a silicon interposer or similar high-density interconnect, the present embodiments may be applicable to other types of interconnects.

In various embodiments, the AC-coupled transceiver 100 includes a transmitter 102 (also referred to as a transmission driver), a receiver 120, and a channel 115 coupled between the transmitter 102 and the receiver 120. In some embodiments, the transmitter 102 includes a serializer 104 to convert a parallel input data stream (dataA) to serial input stream, a Tx inverter 106 coupled to the serializer 104, and an AC-coupled capacitor 110, which is coupled between the AC-coupled capacitor 110 and a first side of the channel 115. Each of the transmitter 102 and the receiver 120 of the AC-coupled transceiver 100 can be referred to as a device or circuit that is to be coupled to the channel 115, where the channel 115 is a part of a die-to-die interconnect or a chip-to-chip interconnect. As mentioned, the channel 115 may be considered a short-reach channel in some embodiments.

In some embodiments, the receiver 120 includes or is coupled to an input node 122, which is coupled to a second side of the channel 115, a transimpedance amplifier that includes a first inverter 126 and a negative feedback resistor 128 coupled to the input node 122, a second inverter 130 coupled to the transimpedance amplifier, and a positive feedback resistor 132 coupled across the transimpedance amplifier and the inverter 130. Following this frontend, the receiver 120 can also include a deserializer 136 coupled to the output of the second inverter 130 and configured to deserialize the data stream to create a received parallel data stream (dataB). In some embodiments, the second inverter 130 and the positive feedback resistor 132 forms a buffer stage that also provides a feedback signal from the Rx frontend back to the input node 122. The input node 122 can be a terminal, a pin, a pad, or the like structure to couple channel 115 to the receiver 120.

In at least some embodiments, the AC-coupled transceiver 100 reduces the power of data transmission by reducing the AC swing. For example, at the input node 122, the AC swing $V_{pp,ac}=V_{dd,tx}C_{ac}/(C_{ac}+C_{load})$, where $V_{dd,tx}$ is the supply voltage of the transmitter 102 and the two capacitors $C_{ac}$ and $C_{load}$ are the AC-coupled capacitor 110 and a load capacitor 118, which is associated with the channel 115. In embodiments, on the Rx side, the role of the receiver 120 is to amplify the AC component from the transmitter 102 while recovering the DC component, which has been blocked by the AC-coupled capacitor 110. The first inverter 126 and the negative feedback resistor 128 can form a transimpedance amplifier (TIA) that sets the input common-mode (CM) voltage to approximately half of VDD (e.g., the digital domain supply voltage) and amplifies the incoming AC signal. In some embodiments, the first inverter 126, the second inverter 130, and the negative feedback resistor 128 form a latch (positive feedback) to maintain the DC logic levels at the input node 122.

If impedance of the first and second inverters 126 and 130 are ignored, the approximate DC logic-high level, DC logic-low level, and DC swing right at the input node 122 can be characterized as follows:

$$DC\ logic-high\ level = \left(\frac{R_{nfb}}{R_{pfb} + R_{nfb}}\right)V_{dd,rx}$$

$$DC\ logic-low\ level = \left(\frac{R_{pfb}}{R_{pfb} + R_{nfb}}\right)V_{dd,rx}$$

$$DC\ swing\ V_{pp,dc} = \left(\frac{R_{nfb} - R_{pfb}}{R_{pfb} + R_{nfb}}\right)V_{dd,rx}$$

At the input node 122, zero ISI (inter-symbol interference) is achieved if $V_{pp,ac}=V_{pp,dc}$, e.g., the AC voltage swing matches the DC voltage swing. The AC voltage swing and the DC voltage swing can be recharacterized as:

$$AC\ swing\ V_{pp,ac} = \left(\frac{C_{ac}}{C_{ac} + C_{load}}\right)V_{dd,tx}$$

$$DC\ swing\ V_{pp,dc} = \left(\frac{R_{nfb} - R_{pfb}}{R_{pfb} + R_{nfb}}\right)V_{dd,rx}$$

To equalize the DC swing and AC swing, calibration circuitry 150 can be coupled to the transmitter 102 and the receiver 120 to set the correct combination of values (or parameters) for the following components: the AC-coupled capacitor 110, the load capacitor 118, the negative feedback resistor 128, the positive feedback resistor 132, which are indicated with dashed lines as being optionally variable in different embodiments. Further, the Tx supply voltage ($V_{dd,tx}$) and Rx supply voltage ($V_{dd,rx}$) can also be varied.

In embodiments, the transmitter 102 and the receiver 120 are on different dies, so their supplies can be different. Thus, $V_{dd,tx}$ is typically not equal to $V_{dd,rx}$. Further, the transmitter 102 and the receiver 120 are on different dies, so their temperature can be different and the above-listed parameters can have temperature dependence. In the targeted die-to-die application, there are tens to hundreds of channels. Based on the placements of the two dies, and the bump map, the routing distance and metal layers of each channel can be different. Therefore, the load capacitor 118 will likely not be constant. Even if the above-listed parameters could be designed such that in the nominal corner, the DC swing and AC swing are close enough, due to PVT (process, voltage, temperature) variation and process random mismatch, DC swing and AC swing are different in other PVT corners. The various calibration designs and techniques of FIGS. 2-5 will be discussed in detail as solutions to these problems.

In at least some embodiments, to calibrate the duty cycle of the receiver 120, the calibration circuitry 150 can be configured to determine a number of one values and zero values received in the clock pattern over the channel 115. For example, the deserializer 136, which is coupled to an output of the second inverter 130, can be configured to sample, using a local asynchronous clock, an output signal of the second inverter 130 to determine a number of one values and zero values. In embodiments, the local asynchronous clock has a slightly different frequency compared to that of data of the output signal. The local asynchronous clock with a slight frequency offset can thus gradually sweep through the output signal of the second inverter 130. In embodiments, the calibration circuitry 150 can retrieve the number of ones and zeros. In this way, the calibration circuitry 150 can determine the duty cycle based on the number of one values compared to the number of zero values, e.g., the ratio of 1-samples over 0-samples. In embodiments, the calibration circuitry 150 injects, at the input node 122, a DC offset voltage to shift an input common mode voltage to bring the duty cycle towards 50%. As this duty cycle calibration is repeated, the DC offset voltage can be determined that minimizes divergence from 50% duty cycle.

Figure 1B:
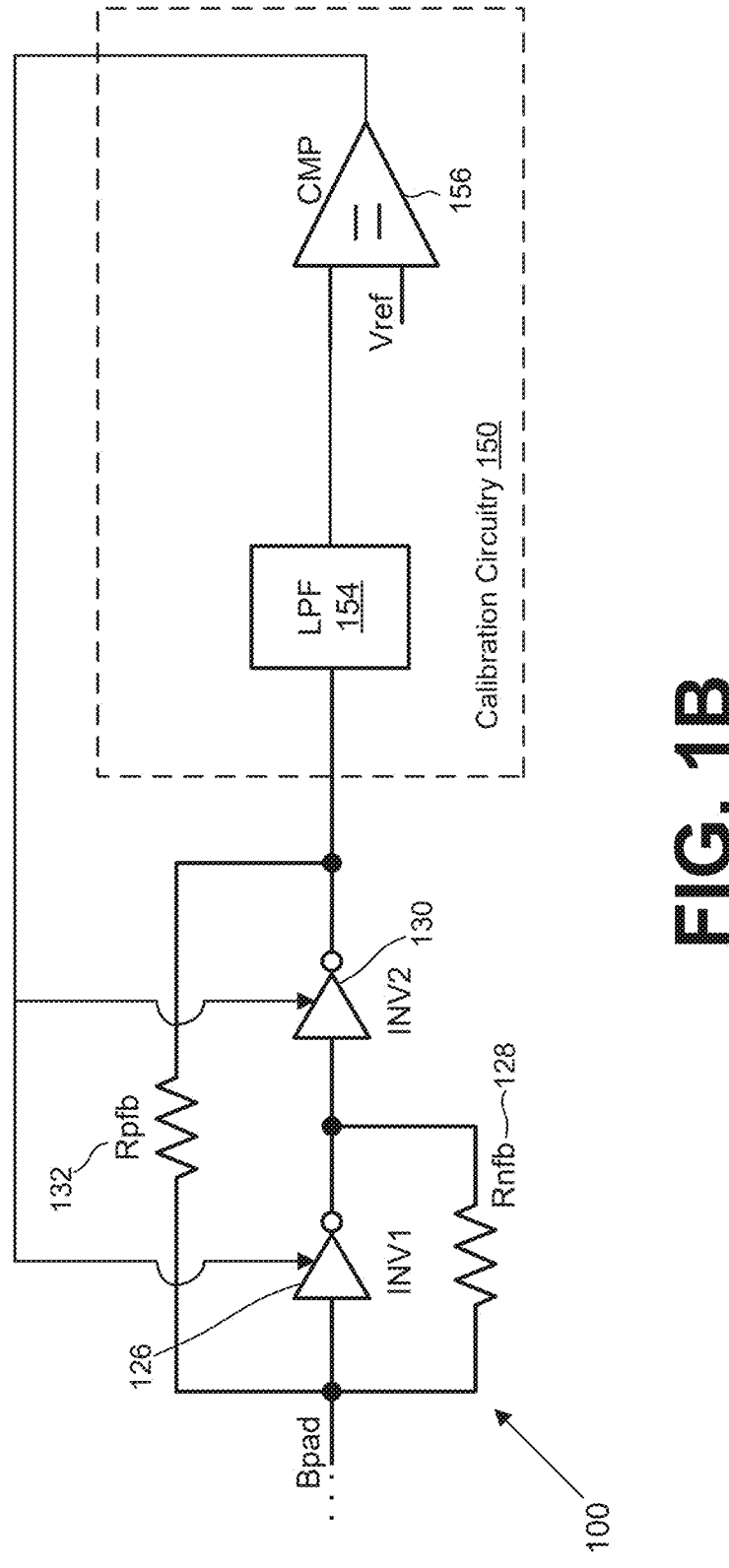
FIG. 1B is a schematic block diagram of part of the calibration circuitry used to calibrate an output common mode voltage of the AC-coupled transceiver according to some embodiments.

FIG. 1B is a schematic block diagram of part of the calibration circuitry 150 used to calibrate an output common mode voltage of the AC-coupled transceiver according to some embodiments. In some embodiments, the transmitter 102, when activated for calibration, can toggle according to a clock pattern before each AC-related digital code. As an alternative to the above-described duty cycle calibration, the calibration circuitry 150 can include a low-pass filter (LPF) 154 coupled to the inverter to extract an output common mode voltage of the transimpedance amplifier. The calibration circuitry 150 can further include a comparator 156 coupled to the LPF 154, the comparator 156 to compare the output common mode voltage to a reference voltage (Vref). For example, Vref can be a predefined reference voltage, such as half of a supply voltage (Vdd). In some embodiments, the calibration circuitry 150 further adjusts relative strengths of p-type metal-oxide semiconductor (PMOS) transistors and n-type MOS (NMOS) transistors of the transimpedance amplifier (TIA) and the inverter 130 to skew rising or falling edges of the output common mode voltage towards those of the reference voltage. Recall that the TIA includes the first inverter 126 and the negative feedback resistor 128 in various embodiments.

Figure 2A:
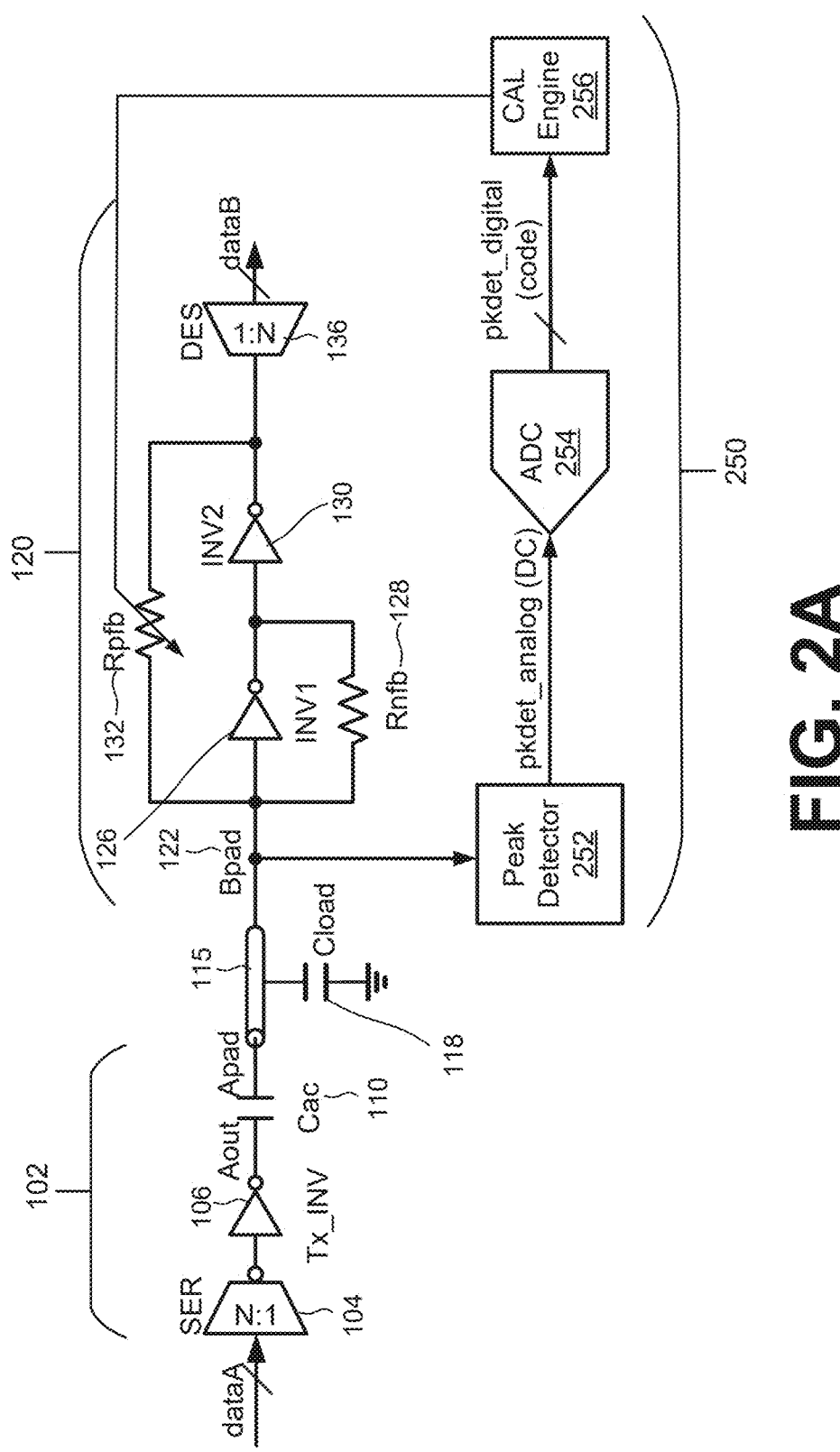
FIG. 2A is a schematic block diagram of an example AC-coupled transceiver designed to perform a receiver (Rx) side DC voltage swing calibration according to at least one embodiment.

FIG. 2A is a schematic block diagram of an example AC-coupled transceiver 200A designed to perform a receiver (Rx) side DC voltage swing calibration according to at least one embodiment. In some embodiments, the AC-coupled transceiver 200A includes the components referred to in FIG. 1A as well as calibration circuitry 250 coupled between the input node 122 and the positive feedback resistor 132. In embodiments, the calibration circuitry 250 modifies a resistance of the positive feedback resistor 132 based on applying each of a plurality of control values. For example, the positive feedback resistor 132 may be a potentiometer, a variable resistor, a bank of selectable resistors, or the like having a resistance that is programmable by the plurality of control values.

In embodiments, the calibration circuitry 250 generates, for each applied control value, a first digital code for a DC swing and a second digital code for an AC swing at the input node 122. In embodiments, the calibration circuitry 250 determines a final control value of the plurality of control values that minimizes a difference between the first and second digital codes. The calibration circuitry 250 can further set the resistance of the positive feedback resistor 132 using the final control value and is to be disabled after calibration, e.g., to save power by not using the calibration circuitry 250 after calibration. This process is explained in more detail with reference to FIG. 4.

More specifically, the calibration circuitry 250 can include a peak detector 252, an ADC 254, and a calibration engine 256. For example, in some embodiments, the peak detector 252 is coupled to the input node 122 and configured to variably detect, at different times, a DC voltage and an envelope of an AC voltage. Thus, the calibration operations can be performed serially for each control value, at one time for the DC voltage swing (when the transmitter 102 is inactive) and another time for the AC voltage swing (when the transmitter 102 is toggling according to a clock pattern). In embodiments, the ADC 254 is coupled to the peak detector 252 and configured to generate the first digital code based on the detected DC voltage and the second digital code based on the detected envelope of the AC voltage. In embodiments, the calibration engine 256 is coupled between the ADC 254 and the positive feedback resistor 132.

In some embodiments, the calibration engine 256 incrementally modifies the resistance of the positive feedback resistor 132 using each control value of the plurality of control values. In embodiments, the calibration engine 256 determines each difference between the first and second digital codes while applying a respective control value of the plurality of control values. In embodiments, the calibration engine 256 identifies the final control value based on the differences between the first and second digital codes for the plurality of control values.

Figure 2B:
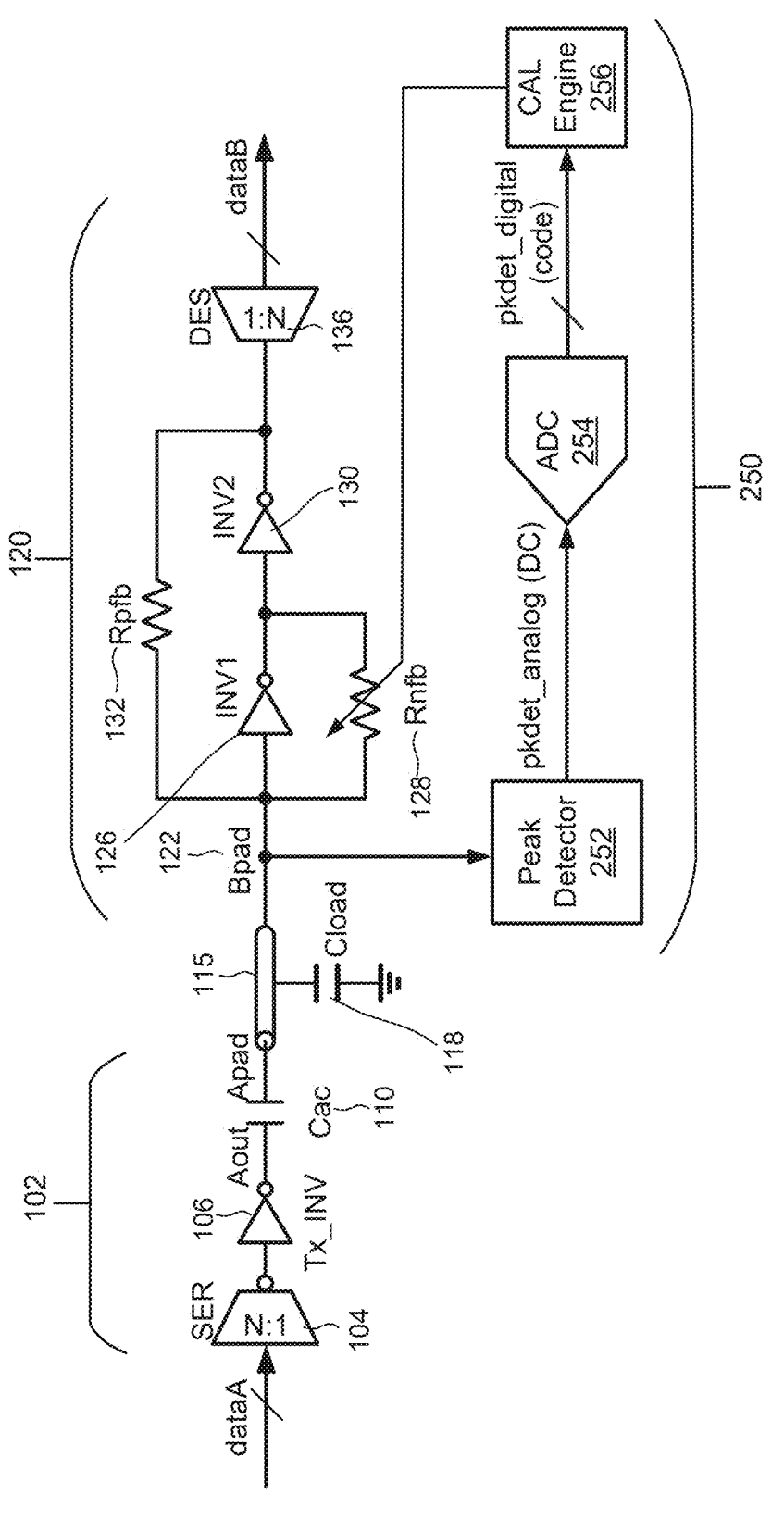
FIG. 2B is a schematic block diagram of an example AC-coupled transceiver designed to perform an Rx side DC voltage swing calibration according to at least one alternative embodiment.

FIG. 2B is a schematic block diagram of an example AC-coupled transceiver 200B designed to perform an Rx side DC voltage swing calibration according to at least one alternative embodiment. In some embodiments, the AC-coupled transceiver 200B includes the components referred to in FIG. 1A as well as calibration circuitry 250 coupled between the input node 122 and the negative feedback resistor 128. In embodiments, the calibration circuitry 250 modifies a resistance of the negative feedback resistor 128 based on each of a plurality of control values. For example, the negative feedback resistor 128 may be a potentiometer, a variable resistor, a bank of selectable resistors, or the like having a resistance that is programmable by the plurality of control values. Tuning the negative feedback resistor 128 may impact the TIA gain and bandwidth of the receiver 120, which can enable tuning a counterinfluence to the positive feedback gain through the positive feedback resistor 132.

In embodiments, the calibration circuitry 250 generates, for each applied control value, a first digital code for a DC swing and a second digital code for an AC swing at the input node 122. In embodiments, the calibration circuitry 250 determines a final control value of the plurality of control values that minimizes a difference between the first and second digital codes. The calibration circuitry 250 can further set the resistance of the negative feedback resistor 128 using the final control value and is to be disabled after calibration, e.g., to save power by not using the calibration circuitry 250 after calibration. This process is explained in more detail with reference to FIG. 4.

More specifically, the calibration circuitry 250 can include the peak detector 252, the ADC 254, and the calibration engine 256. For example, in some embodiments, the peak detector 252 is coupled to the input node 122 and configured to variably detect, at different times, a DC voltage and an envelope of an AC voltage. Thus, the calibration operations can be performed serially for each control value, at one time for the DC voltage swing (when the transmitter 102 is inactive) and another time for the AC voltage swing (when the transmitter 102 is toggling according to a clock pattern). In embodiments, the ADC 254 is coupled to the peak detector 252 and configured to generate the first digital code based on the detected DC voltage and the second digital code based on the detected envelope of the AC voltage. In embodiments, the calibration engine 256 is coupled between the ADC 254 and the negative feedback resistor 128.

In some embodiments, the calibration engine 256 incrementally modifies the resistance of the negative feedback resistor 128 using each control value of the plurality of control values. In embodiments, the calibration engine 256 determines each difference between the first and second digital codes while applying a respective control value of the plurality of control values. In embodiments, the calibration engine 256 identifies the final control value based on the differences between the first and second digital codes for the plurality of control values.

Figure 3A:
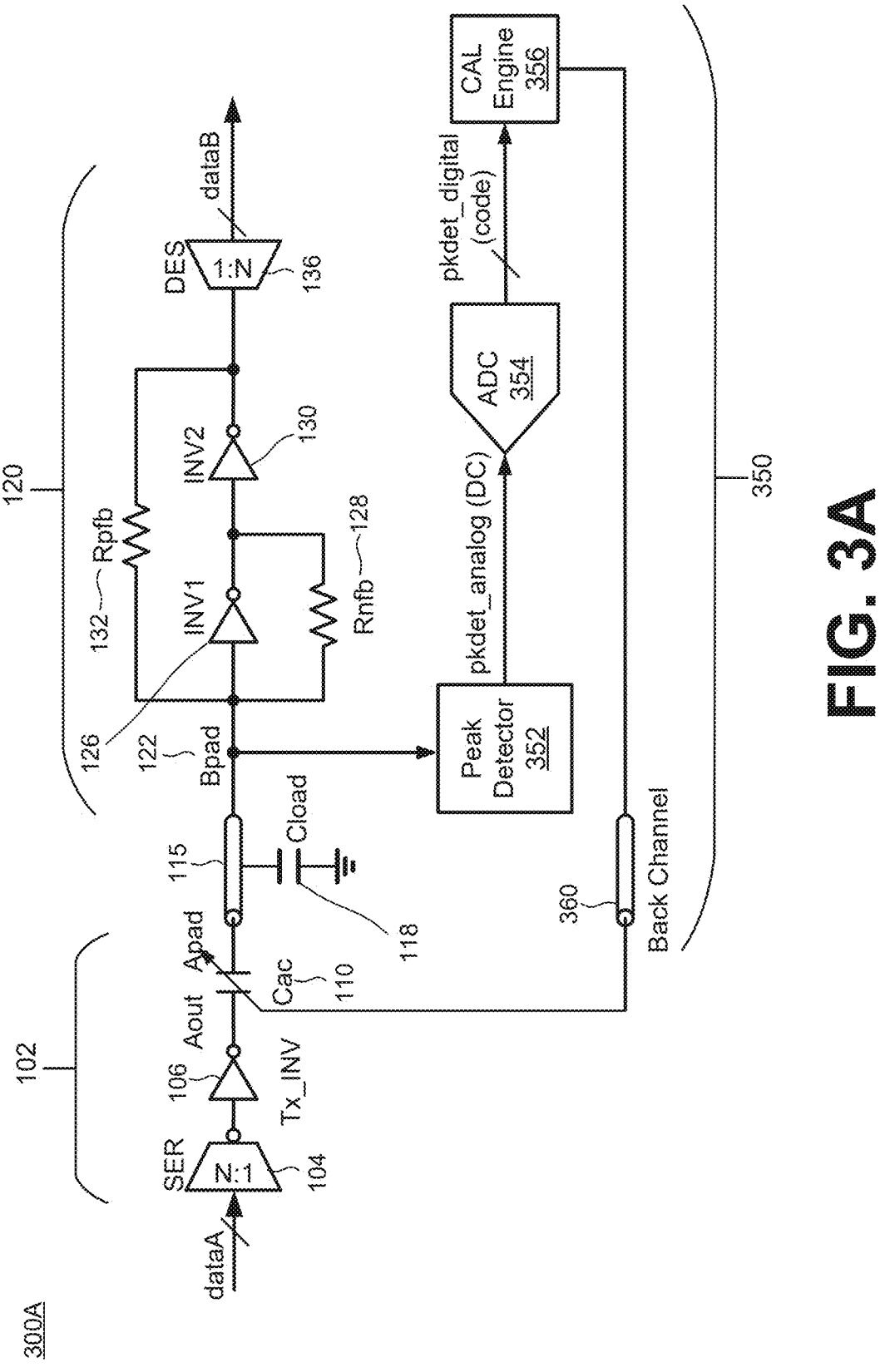
FIG. 3A is a schematic block diagram of an example AC-coupled transceiver designed to perform a transmitter (Tx) side AC voltage swing calibration according to at least one embodiment.

FIG. 3A is a schematic block diagram of an example AC-coupled transceiver 300A designed to perform a transmitter (Tx) side AC voltage swing calibration according to at least one embodiment. In some embodiments, the AC-coupled transceiver 300A includes the components referred to in FIG. 1A as well as calibration circuitry 350 coupled between the input node 122 and the AC-coupled capacitor 110 that is coupled to the first side of the channel 115. In embodiments, the calibration circuitry 350 modifies a capacitance of the AC-coupled capacitor 110 based on each of a plurality of control values. For example, the AC-coupled capacitor 110 128 can be a variable capacitor, a bank of selectable capacitors, or the like that is programmable by each of the plurality of control values. In some embodiments, the AC-coupled transceiver 300A includes a back-channel 360 coupled between the calibration circuitry 350 and the AC-coupled transceiver 110 in order to cross back to the first side of the channel 115 at the transmitter 102 in order to modify the capacitance of AC-coupled capacitor.

In embodiments, the calibration circuitry 350 generates, for each applied control value, a first digital code for a DC swing and a second digital code for an AC swing at the input node 122. In embodiments, the calibration circuitry 350 determines a final control value of the plurality of control values that minimizes a difference between the first and second digital codes. The calibration circuitry 350 can further set the capacitance of the AC-coupled capacitor 110 using the final control value and is to be disabled after calibration, e.g., to save power by not using the calibration circuitry 350 after calibration. This process is explained in more detail with reference to FIG. 4.

More specifically, the calibration circuitry 350 can include a peak detector 352, an ADC 354, and a calibration engine 356. For example, in some embodiments, the peak detector 352 is coupled to the input node 122 and configured to variably detect, at different times, a DC voltage and an envelope of an AC voltage. Thus, the calibration operations can be performed serially for each control value, at one time for the DC voltage swing (when the transmitter 102 is inactive) and another time for the AC voltage swing (when the transmitter 102 is toggling according to a clock pattern). In embodiments, the ADC 354 is coupled to the peak detector 352 and configured to generate the first digital code based on the detected DC voltage and the second digital code based on the detected envelope of the AC voltage. In embodiments, the calibration engine 356 is coupled between the ADC 354 and the AC-coupled capacitor 110, e.g., across the back channel.

In various embodiments, the calibration engine 356 incrementally modifies the capacitance of the AC-coupled capacitor 110 using each control value of the plurality of control values. The calibration engine 355 can determine each difference between the first and second digital codes while applying a respective control value of the plurality of control values and identify the final control value based on the differences between the first and second digital codes for the plurality of control values.

Figure 3B:
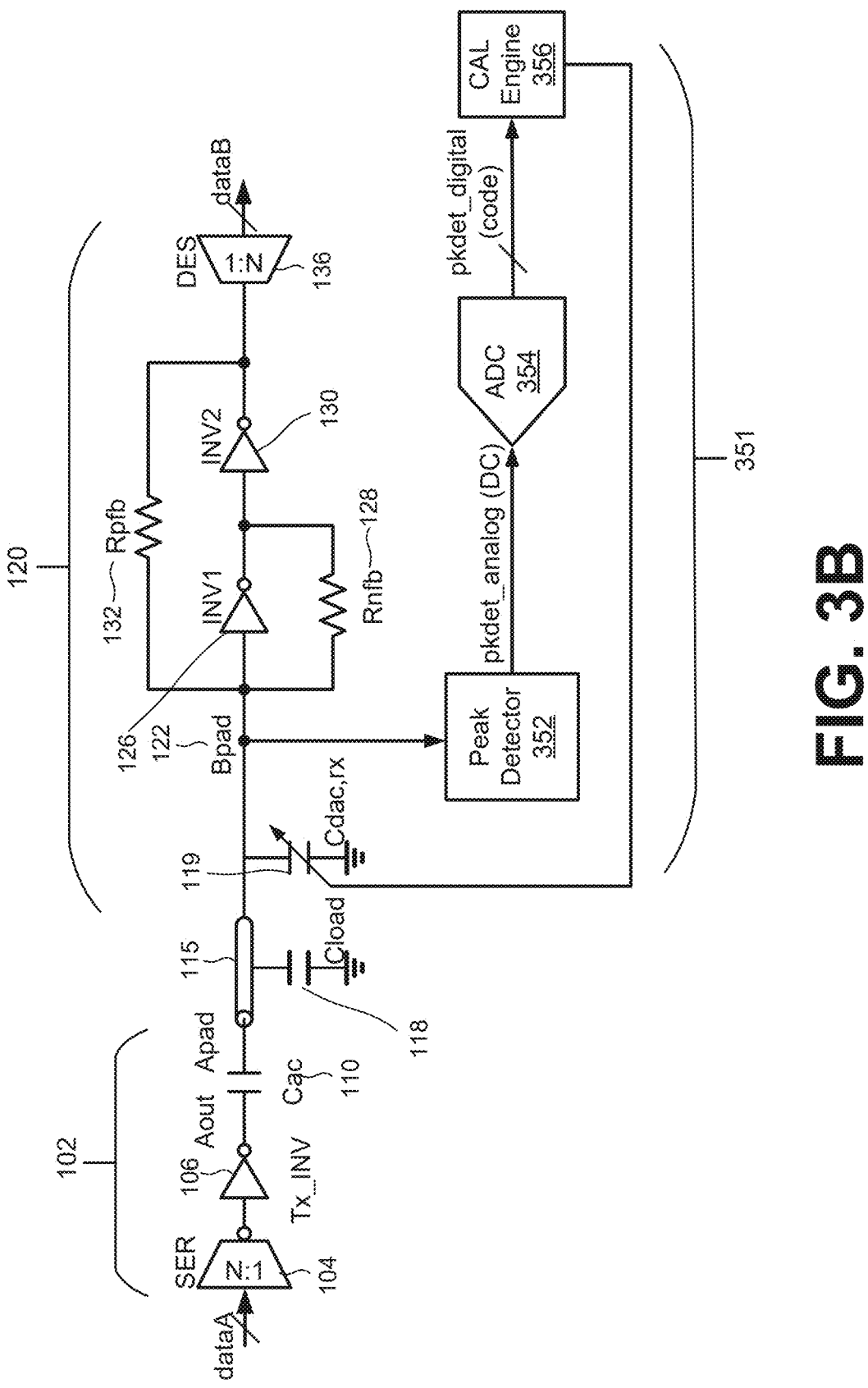
FIG. 3B is a schematic block diagram of an example AC-coupled transceiver designed to perform Rx side AC voltage swing calibration according to at least one embodiment.

FIG. 3B is a schematic block diagram of an example AC-coupled transceiver 300B designed to perform Rx side AC voltage swing calibration according to at least one embodiment. In some embodiments, the AC-coupled transceiver 300B includes the components referred to in FIG. 1A as well as a receiver (Rx) capacitor 119 (which is at least one capacitor) coupled between the channel 115 and a ground, e.g., at the input node 122 on the receiver 120 side of the AC-coupled transceiver 300B. The AC-coupled transceiver 300B can further include calibration circuitry 351 coupled between the input node 122 and the Rx capacitor 119. In embodiments, the calibration circuitry 351 modifies a capacitance of the Rx capacitor 119 based on each of a plurality of control values. For example, the Rx capacitor 119 can be a variable capacitor, a bank of selectable capacitors, or the like that is programmable by each of the plurality of control values. In embodiments, assuming the Rx capacitor 119 is a capacitor bank ($C_{DAC,rx}$), the total loading from the added capacitors (which are selectable) can be expressed as $C_{load}'=C_{load}+C_{DAC,rx}$. Thus, the AC voltage swing can be expressed as $V_{pp,ac}=V_{dd,tx} C_{ac}/(C_{ac}+C_{load}')$.

In embodiments, the calibration circuitry 350 generates, for each applied control value, a first digital code for a DC swing and a second digital code for an AC swing at the input node 122. In embodiments, the calibration circuitry 351 determines a final control value of the plurality of control values that minimizes a difference between the first and second digital codes. The calibration circuitry 351 can further set the capacitance of the Rx capacitor 119 using the final control value and is to be disabled after calibration, e.g., to save power by not using the calibration circuitry 351 after calibration. This process is explained in more detail with reference to FIG. 4.

More specifically, the calibration circuitry 351 can include the peak detector 352, the ADC 354, and the calibration engine 356. For example, in some embodiments, the peak detector 352 is coupled to the input node 122 and configured to variably detect, at different times, a DC voltage and an envelope of an AC voltage. Thus, the calibration operations can be performed serially for each control value, at one time for the DC voltage swing (when the transmitter 102 is inactive) and another time for the AC voltage swing (when the transmitter 102 is toggling according to a clock pattern). In embodiments, the ADC 354 is coupled to the peak detector 352 and configured to generate the first digital code based on the detected DC voltage and the second digital code based on the detected envelope of the AC voltage. In embodiments, the calibration engine 356 is coupled between the ADC 354 and the Rx capacitor 119.

In various embodiments, the calibration engine 356 incrementally modifies the capacitance of the Rx capacitor 119 using each control value of the plurality of control values. The calibration engine 355 can determine each difference between the first and second digital codes while applying a respective control value of the plurality of control values and identify the final control value based on the differences between the first and second digital codes for the plurality of control values.

Figure 4:
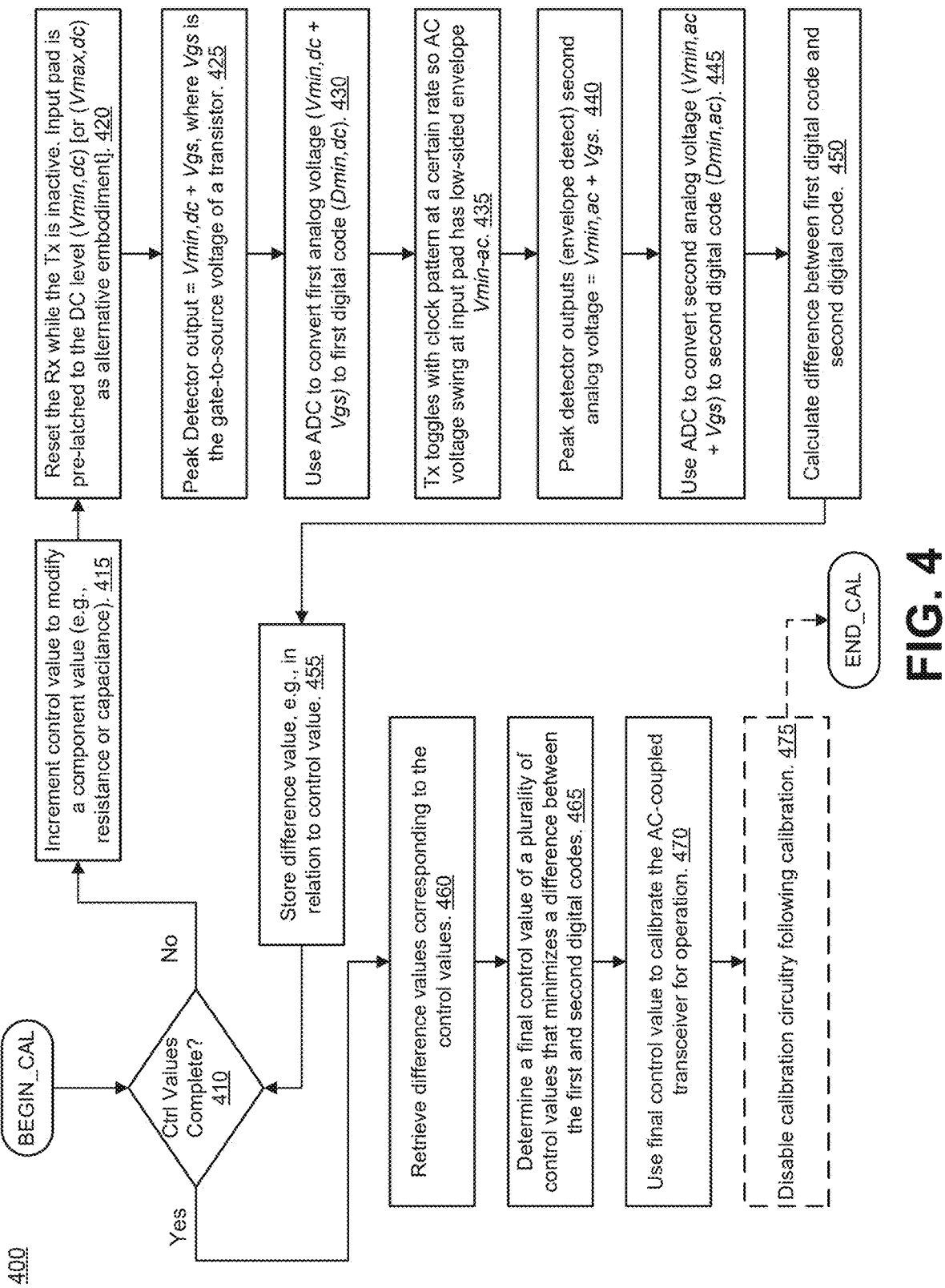
FIG. 4 is a flow chart of a method for performing calibration using calibration circuitry coupled to an AC-coupled transceiver according to various embodiments.

FIG. 4 is a flow chart of a method 400 for performing calibration using calibration circuitry coupled to an AC-coupled transceiver according to various embodiments. In various embodiments, the method 400 is performed by processing logic of any of the calibration circuitry 150, 250, 350, or 351 of FIG. 1, FIGS. 2A-2B, and FIGS. 3A-3B, respectively. The processing logic can include hardware, firmware, or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel.

Additionally, one or more processes can be omitted in various embodiments. Thus, not all processes are required in every embodiment. Other process flows are possible.

At operation 410, the processing logic determines whether the control values have been completely rotated through for performing calibration using the plurality of control values.

At operation 415, assuming there is still at least one control value left at operation 410, the processing logic increments the control value to a next control value to modify a component value based on that next control value. So, for example, the processing logic may use the next control value to modify a resistance of the positive feedback resistor 132 (FIG. 2A), a resistance of the negative feedback resistor 128 (FIG. 2B), a capacitance of the AC-coupled capacitor 110 (FIG. 3A), or a capacitance of the Rx resistor 119 (FIG. 3B). In embodiments, the control values are stepped through for each of these components separately or only for one or more of the components.

At operation 420, the processing logic resets the receiver 120 while the transmitter 102 is inactive. At this point, the input node 122 is pre-latched to a DC voltage level, either to a minimum DC voltage level (Vmin,dc) or a maximum DC voltage level (Vmax,dc). Thus, according to different embodiments, the peak detector of each embodiment may detect either extreme of the DC voltage and of the envelope of the AC signals. For example, to simplify the design, the AC-coupled transceiver may only detect the minimum (or low) or maximum (or high) side of the DC voltage swing and of the AC voltage swing. In the alternative, if two peak detectors are employed, the two peak detectors can detect both sides of the DC or AC voltage swings. For simplicity of explanation, the rest of the method 400 of FIG. 4 is explained assuming that minimum DC and AC voltage levels are being detected, although in other embodiments, the same operations are equally applicable to instead detecting and employing maximum DC and AC voltage levels.

Figure 5A:
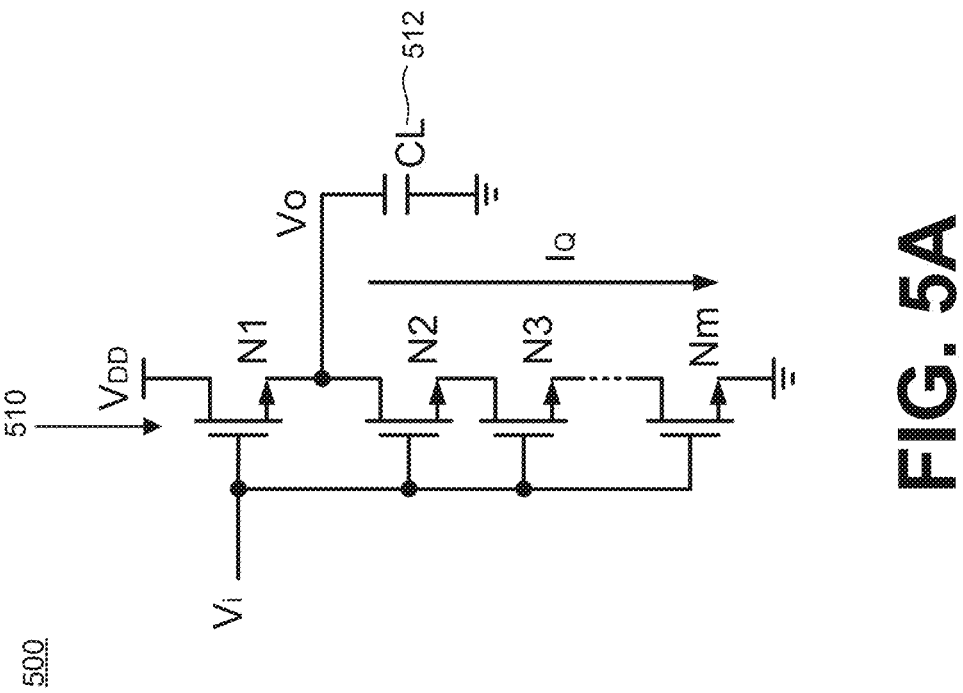
FIG. 5A is a schematic block diagram of an example peak detector useable in the disclosed calibration circuitry according to some embodiments.
Figure 6B:
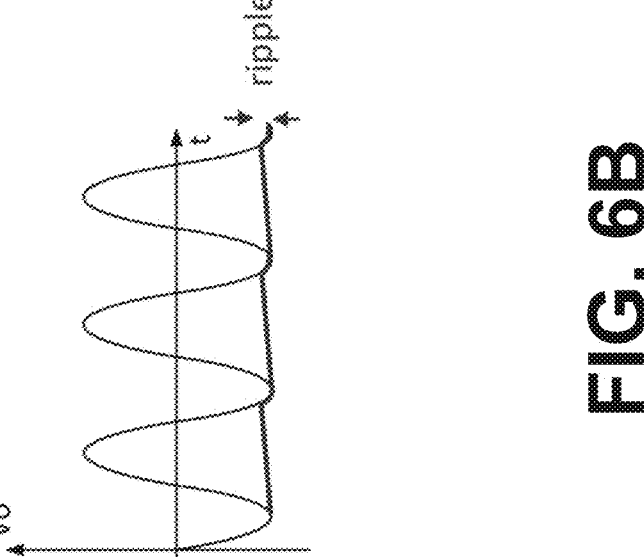
FIG. 6B is a graph of example input and output waveforms of the peak detector of FIG. 6A according to an embodiment.
Figure 6A:
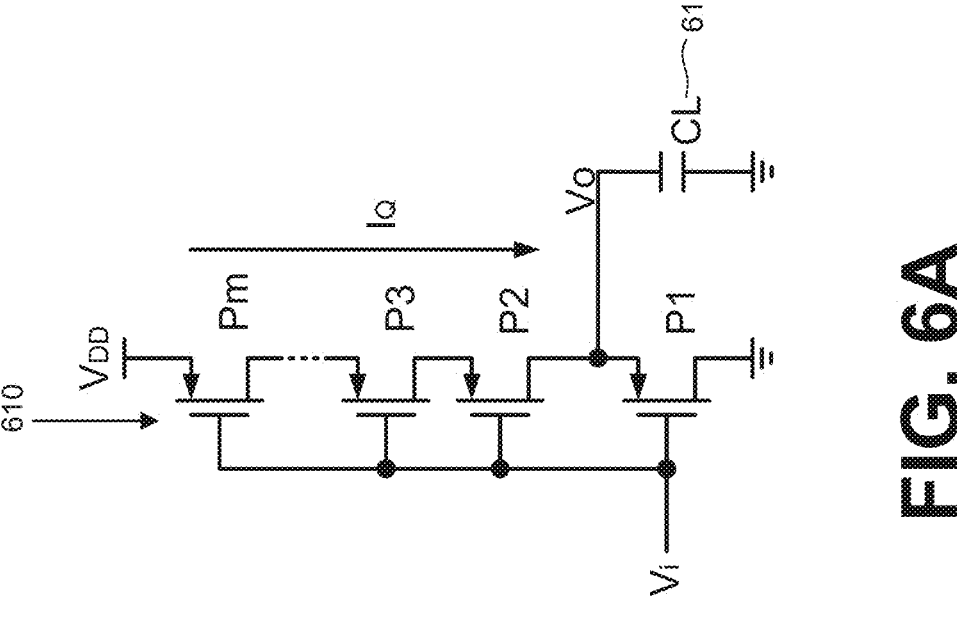
FIG. 6A is a schematic block diagram of an example peak detector useable in the disclosed calibration circuitry according to other embodiments.

At operation 425, the processing logic (e.g., peak detector) detects a first analog voltage equal to the minimum DC voltage (Vmin,dc) and outputs the minimum DC voltage plus Vgs, the gate-to-source voltage of a transistor of the peak detector, e.g., a NMOS transistor for maximum voltage detection (FIG. 5A) or a PMOS transistor for minimum voltage detection (FIG. 6A). If the peak detector is to detect the maximum DC voltage, the first analog voltage may instead be equal to the maximum DC voltage (Vmax,dc) minus the Vgs.

At operation 430, the processing logic uses an ADC to convert the first analog voltage to a first digital code (Dmin, dc). In some embodiments, related to operations 420-430, the processing logic (e.g., any of the calibration engines) determines that the AC-coupled transmitter is inactive and an input of the receiver 120 is reset before reading each first digital code from the ADC for a respective control value. In other embodiments, the processing logic transmitter 102 and the receiver 120 are each configured to apply an operational protocol depending on the phase. Thus, in a first phase or two phases of operation, the transmitter 102 knows to remain inactive while the receiver 120 knows that the transmitter is inactive and can perform the DC-voltage-based detecting of operations 420-430.

At operation 435, the processing logic causes (or determines) that the transmitter 102 toggles with a clock pattern at a certain rate so that the AC voltage swing has a low-sided envelope (Vmin–ac).

At operation 440, the processing logic (e.g., peak detector) detects and outputs a second analog voltage based on the envelope detection, e.g., where the second analog voltage is the minimum AC voltage swing (Vmin,ac) plus Vgs.

At operation 445, the processing logic uses the ADC to convert the second analog voltage (Vmin,ac+Vgs) to a second digital code (Dmin,ac) for the particular control value. Thus, in some embodiments, the processing logic can determine that the AC-coupled transmitter 102 is toggling according to a clock pattern before reading each second digital code from the ADC. Or, in the alternative embodiment, the transmitter 102 and receiver 120 can operate according to a second phase of the operational protocol in which the transmitter 102 knows to proactively start transmitting the clock pattern and the receiver 120 knows that the transmitter is transmitting a toggled clock pattern.

At operation 450, the processing logic calculates the different between the first digital code and the second digital code, which for the particular control value, digitally quantifies a difference between the DC voltage swing and the AC voltage swing (whether at the minimum or the maximum side of the voltage swings).

At operation 455, the processing logic stores (or buffers) the difference value, e.g., in relation to the particular control value, and loops back to operation 410. After the control values are incremented through (operation 415) and operations 420-450 are repeated for each control value, the processing logic determines, at operation 410, that there are no more control values and proceeds to operation 460.

At operation 460, the processing log retrieves the difference values corresponding to the control values.

At operation 465, the processing logic determines a final control value of the plurality of control values that minimizes a difference between the first and second digital codes.

At operation 470, the processing logic uses the final control value to calibrate the AC-coupled transceiver for operation. Thus, the processing logic (e.g., calibration circuitry) can modify the value (resistance or capacitance) of the tested for component based on the control value, e.g., the resistance of the positive feedback resistor 132 (FIG. 2A), the resistance of the negative feedback resistor 128 (FIG. 2B), the capacitance of the AC-coupled capacitor 110 (FIG. 3A), or the capacitance of the Rx resistor 119 (FIG. 3B).

At operation 475, the processing logic optionally disables the calibration circuitry so to conserve power during post-calibration operation of the AC-coupled transceiver.

Figure 5B:
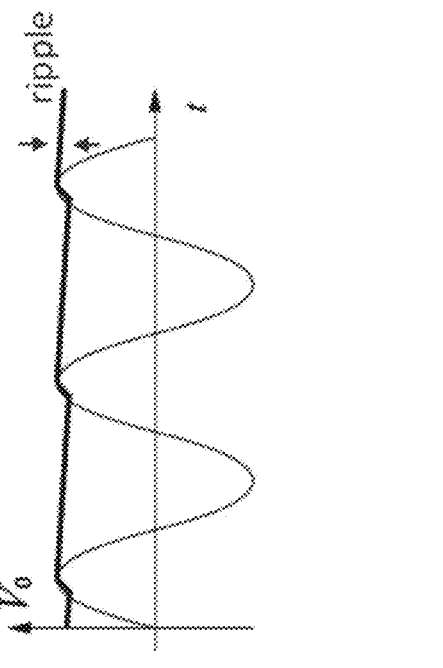
FIG. 5B is a graph of example input and output waveforms of the peak detector of FIG. 5A according to an embodiment.

FIG. 5A is a schematic block diagram of an example peak detector 500 useable in the disclosed calibration circuitry according to some embodiments. FIG. 5B is a graph of example input and output waveforms of the peak detector 500 of FIG. 5A according to an embodiment. In embodiments, the detected DC voltage is a maximum DC voltage formed by the positive and negative feedback resistors 132 and 128 and a detected high-sided envelope of the AC voltage is a maximum AC voltage.

In some embodiments, the peak detector 500 includes a plurality of n-type metal-oxide semiconductor (NMOS) transistors 510 that are source-drain coupled and that have gates coupled together. The NMOS transistors 510 are individually labeled as N1, N2, N3, . . . . Nm. The peak detector 500 can further include a capacitor 512 coupled to an output of a first NMOS transistor (N1), of the plurality of NMOS transistors, that is coupled to a supply voltage (Vdd). In embodiments, a current of the peak detector 500 is asymmetrically modulated by an input voltage (Vi) to the plurality of NMOS transistors 510 so that the peak detector 500 functions as a single-direction rectifier biased towards the maximum DC voltage.

More specifically, in some embodiments, both the pullup and pulldown currents (together current IQ) of the peak detector 500 are modulated by the input voltage (Vi). In embodiments, the pullup and pulldown current are both modulated by the input voltage but in an asymmetrical way such that the peak detector 500 can achieve fast settling and small ripple at the same time (see FIG. 5B). For the NMOS version of the peak detector 500, when Vi goes up, the current through N1 and {N2, N3, . . . , Nm} increases. The peak detector 500 can operate as a source follower, e.g., where the N1 transistor is a transconductance device (Gm) device and the {N2, N3, . . . , Nm} transistors are a tail current device. A source follower with higher biased current can provide higher bandwidth, so Vo ramps up quickly. When Vi goes down, N1 is weakened or disabled, and the current through {N2, N3, . . . , Nm} is lower, so the (N2, N3, . . . , Nm) transistors do not pulldown Vo by too much. Because, for the peak detector 500, Vo is to track the higher envelope of Vi and stay high, by reducing the biased current when Vi swings low, the peak detector 500 can reduce the ripple on Vo, as illustrated in FIG. 5B.

FIG. 6A is a schematic block diagram of an example peak detector 600 useable in the disclosed calibration circuitry according to other embodiments. FIG. 6B is a graph of example input and output waveforms of the peak detector 600 of FIG. 6A according to an embodiment. In some embodiments, the detected DC voltage by any peak detector discussed herein is a minimum DC voltage formed by the positive and negative feedback resistors 132 and 128 and a detected low-sided envelope of the AC voltage is a minimum AC voltage.

In some embodiments, the peak detector 600 includes a plurality of p-type metal-oxide semiconductor (PMOS) transistors 610 that are source-drain coupled and that have gates coupled together. The PMOS transistors 610 are individually labeled as P1, P2, P3, . . . . Pm. The peak detector 600 can further include a capacitor 612 coupled to an output of a first PMOS transistor (P1), of the plurality of PMOS transistors, that is coupled to ground. In embodiments, a current of the peak detector is asymmetrically modulated by an input voltage (Vi) to the plurality of PMOS transistors 610 so that the peak detector functions as a single-direction rectifier biased towards the minimum DC voltage.

More specifically, in some embodiments, both the pullup and pulldown currents (together current IQ) of the peak detector 600 are modulated by an input voltage (Vi). In embodiments, the pullup and pulldown current are both modulated by the input voltage but in an asymmetrical way such that the peak detector 600 can achieve fast settling and small ripple at the same time (see FIG. 6B). For the PMOS version of the peak detector 600, when Vi goes down, the current through P1 and {P2, P3, . . . , Pm} increases. The circuit acts as a source follower where the P1 transistor is a transconductance (Gm) device and the {P2, P3, . . . , Pm} transistors are a tail current device. A source follower with higher biased current can provide higher bandwidth, so Vo ramps down quickly. When Vi goes up, P1 is weakened or disabled, and the current through {P2, P3, . . . , Pm} is lower, so the {P2, P3, . . . , Pm} transistors do not pullup Vo by too much. Since for the peak detector 600, Vo is to track the lower envelope of Vi and stay low (towards the minimum voltage swing), by reducing the biased current when Vi swings high, the peak detector 600 can reduce the ripple on Vo, as illustrated in FIG. 6B.

Other variations are within the scope of the present disclosure. Thus, while disclosed techniques are susceptible to various modifications and alternative constructions, cer-tain illustrated embodiments thereof are shown in drawings and have been described above in detail. It should be understood, however, that there is no intention to limit the disclosure to a specific form or forms disclosed, but on the contrary, the intention is to cover all modifications, alterna-tive constructions, and equivalents falling within the spirit and scope of the disclosure, as defined in appended claims.

Use of terms "a" and "an" and "the" and similar referents in the context of describing disclosed embodiments (espe-cially in the context of following claims) are to be construed to cover both singular and plural, unless otherwise indicated herein or clearly contradicted by context, and not as a definition of a term. Terms "comprising," "having," "includ-ing," and "containing" are to be construed as open-ended terms (meaning "including, but not limited to,") unless otherwise noted. "Connected," when unmodified and refer-ring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by con-text, is to be construed as a nonempty collection comprising one or more members. Further, unless otherwise noted or contradicted by context, the term "subset" of a correspond-ing set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be per-formed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collec-tively on one or more processors, by hardware or combina-tions thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein, and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to actions and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously, or intermittently. In at least one embodiment, the terms "system" and "method" are used herein interchangeably insofar as the system may embody one or more methods, and methods may be considered a system.

In the present document, references may be made to obtaining, acquiring, receiving, or inputting analog or digital data into a sub-system, computer system, or computer-implemented machine. In at least one embodiment, the process of obtaining, acquiring, receiving, or inputting analog and digital data can be accomplished in a variety of ways, such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface, or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that the subject matter claimed in appended claims is not necessarily limited to specific features or acts described. Rather, specific features and acts are disclosed as exemplary forms of implementing the claims.

What is claimed is:

1. A circuit comprising:
   a receiver coupled to an input node and comprising a transimpedance amplifier, wherein the input node is to be coupled to a transmitter over a channel; and
   calibration circuitry coupled to the input node, the calibration circuitry to:
   modify a resistance of a feedback resistor of the receiver by applying a plurality of control values;
   generate, for each applied control value, a first digital code for a direct current (DC) swing and a second digital code for an alternating current (AC) swing at the input node; and

determine a final control value of the plurality of control values that minimizes a difference between the first and second digital codes.

2. The circuit of claim 1, wherein the feedback resistor is one of a negative feedback resistor or a positive feedback resistor, and wherein the transimpedance amplifier comprises the negative feedback resistor, further comprising an inverter coupled to the transimpedance amplifier, and wherein the positive feedback resistor is coupled across the transimpedance amplifier and the inverter.

3. The circuit of claim 2, wherein the receiver further comprises a deserializer coupled to an output of the inverter and to sample, using a local asynchronous clock, an output signal of the inverter to determine a number of one values and zero values, wherein the calibration circuitry is further to:

retrieve, from the deserializer, the number of one values and zero values;

determine a duty cycle based on the number of one values compared to the number of zero values; and inject, at the input node, a DC offset voltage to shift an input common mode voltage to bring the duty cycle towards 50%.

4. The circuit of claim 3, wherein the calibration circuitry further comprises:

a low-pass filter (LPF) coupled to the inverter to extract an output common mode voltage of the transimpedance amplifier; and a comparator coupled to the LPF, the comparator to compare the output common mode voltage to a reference voltage; and wherein the calibration circuitry is further to adjust relative strengths of p-type metal-oxide semiconductor (PMOS) and N-type metal-oxide semiconductor (NMOS) transistors of the transimpedance amplifier and the inverter to skew rising or falling edges of the output common mode voltage towards those of the reference voltage.

5. The circuit of claim 3, wherein the feedback resistor is one of a negative feedback resistor or a positive feedback resistor that is programmable by the plurality of control values, and wherein the calibration circuitry is further to set the resistance of the one of the negative feedback resistor or the positive feedback resistor using the final control value and is to be disabled after calibration.

6. The circuit of claim 1, wherein the feedback resistor is one of a negative feedback resistor or a positive feedback resistor, and wherein the calibration circuitry comprises:

a peak detector coupled to the input node, the peak detector to variably detect, at different times, a DC voltage and an envelope of an AC voltage;

an analog-to-digital converter (ADC) coupled to the peak detector, the ADC to generate the first digital code based on the detected DC voltage and the second digital code based on the detected envelope of the AC voltage; and a calibration engine coupled between the ADC and the one of the negative feedback resistor or the positive feedback resistor, wherein the calibration engine is to:

incrementally modify the resistance using each control value of the plurality of control values;

determine each difference between the first and second digital codes while applying a respective control value of the plurality of control values; and identify the final control value based on the differences between the first and second digital codes for the plurality of control values.

7. The circuit of claim 6, wherein the calibration engine is further to:

determine that the transmitter is inactive and an input of the receiver is reset before reading each first digital code from the ADC; and determine that the transmitter is toggling according to a clock pattern before reading each second digital code from the ADC.

8. The circuit of claim 6, wherein the detected DC voltage is a minimum DC voltage formed by the positive and negative feedback resistors and a detected low-sided envelope of the AC voltage is a minimum AC voltage, and wherein the peak detector comprises:

a plurality of p-type metal-oxide semiconductor (PMOS) transistors that are source-drain coupled and that have gates coupled together; and a capacitor coupled to an output of a first PMOS transistor, of the plurality of PMOS transistors, that is coupled to ground, wherein a current of the peak detector is asymmetrically modulated by an input voltage to the plurality of PMOS transistors so that the peak detector functions as a single-direction rectifier biased towards the minimum DC voltage.

9. The circuit of claim 6, wherein the detected DC voltage is a maximum DC voltage formed by the positive and negative feedback resistors and a detected high-sided envelope of the AC voltage is a maximum AC voltage, and wherein the peak detector comprises:

a plurality of n-type metal-oxide semiconductor (NMOS) transistors that are source-drain coupled and that have gates coupled together; and a capacitor coupled to an output of a first NMOS transistor, of the plurality of NMOS transistors, that is coupled to a supply voltage, wherein a current of the peak detector is asymmetrically modulated by an input voltage to the plurality of NMOS transistors so that the peak detector functions as a single-direction rectifier biased towards the maximum DC voltage.

10. A system comprising:

a first device comprising a capacitor coupled to a first side of a channel and a transmitter coupled to the capacitor;

a second device comprising a receiver having a transimpedance amplifier coupled to an input node, wherein the input node is to be coupled to a second side of the channel; and calibration circuitry coupled between the input node and the capacitor, the calibration circuitry to:

modify a capacitance of the capacitor based on each of a plurality of control values;

generate, for each control value, a first digital code for a direct current (DC) swing and a second digital code for an alternating current (AC) swing at the input node; and determine a final control value of the plurality of control values that minimizes a difference between the first and second digital codes.

11. The system of claim 10, wherein the capacitor is programmable by the plurality of control values, further comprising a back channel coupled between the calibration circuitry and the capacitor.

12. The system of claim 10, wherein the calibration circuitry is further to set the capacitance of the capacitor using the final control value and is to be disabled after calibration.

13. The system of claim 10, wherein the calibration circuitry comprises:

a peak detector coupled to the input node, the peak detector to variably detect, at different times, a DC voltage and an envelope of an AC voltage;

an analog-to-digital converter (ADC) coupled to the peak detector, the ADC to generate the first digital code based on the detected DC voltage and the second digital code based on the detected envelope of the AC voltage; and a calibration engine coupled between the ADC and the capacitor, wherein the calibration engine is to:
incrementally modify the capacitance using each control value of the plurality of control values;
determine each difference between the first and second digital codes while applying a respective control value of the plurality of control values; and
identify the final control value based on the differences between the first and second digital codes for the plurality of control values.

14. The system of claim 13, wherein the calibration engine is further to:
determine that the transmitter is inactive and an input of the receiver is reset before reading each first digital code from the ADC; and
determine that the transmitter is toggling according to a clock pattern before reading each second digital code from the ADC.

15. The system of claim 13, wherein the detected DC voltage is a minimum DC voltage formed by positive and negative feedback resistors of the receiver and a detected low-sided envelope of the AC voltage is a minimum AC voltage, and wherein the peak detector comprises:
a plurality of p-type metal-oxide semiconductor (PMOS) transistors that are source-drain coupled and that have gates coupled together; and
a capacitor coupled to an output of a first PMOS transistor, of the plurality of PMOS transistors, that is coupled to ground, wherein a current of the peak detector is asymmetrically modulated by an input voltage to the plurality of PMOS transistors so that the peak detector functions as a single-direction rectifier biased towards the minimum DC voltage.

16. The system of claim 13, wherein the detected DC voltage is a maximum DC voltage formed by positive and negative feedback resistors of the receiver and a detected high-sided envelope of the AC voltage is a maximum AC voltage, and wherein the peak detector comprises:
a plurality of n-type metal-oxide semiconductor (NMOS) transistors that are source-drain coupled and that have gates coupled together; and
a capacitor coupled to an output of a first NMOS transistor, of the plurality of NMOS transistors, that is coupled to a supply voltage, wherein a current of the peak detector is asymmetrically modulated by an input voltage to the plurality of NMOS transistors so that the peak detector functions as a single-direction rectifier biased towards the maximum DC voltage.

17. The system of claim 10, further comprising:
an inverter coupled to the transimpedance amplifier;
a positive feedback resistor coupled across the transimpedance amplifier and the inverter; and
a deserializer coupled to an output of the inverter and to sample, using a local asynchronous clock, an output signal of the inverter to determine a number of one values and zero values;
wherein the calibration circuitry is further to:
retrieve, from the deserializer, the number of one values and zero values;

determine a duty cycle based on the number of one values compared to the number of zero values; and inject, at the input node, a DC offset voltage to shift an input common mode voltage to bring the duty cycle towards 50%.

18. The system of claim 10, wherein the transimpedance amplifier has a negative feedback resistor coupled to the input node, further comprising:
an inverter coupled to the transimpedance amplifier; and
a positive feedback resistor coupled across the transimpedance amplifier and the inverter;
wherein the calibration circuitry further comprises:
a low-pass filter (LPF) coupled to the inverter to extract an output common mode voltage of the transimpedance amplifier; and
a comparator coupled to the LPF, the comparator to compare the output common mode voltage to a reference voltage; and
wherein the calibration circuitry is further to adjust relative strengths of p-type metal-oxide semiconductor (PMOS) and n-type metal-oxide semiconductor (NMOS) transistors of the transimpedance amplifier and the inverter to skew rising or falling edges of the output common mode voltage towards rising or falling edges of the reference voltage.

19. A circuit comprising:
a receiver to be coupled to a channel, which is coupled to a transmitter, wherein the receiver comprises:
at least one capacitor coupled between the channel and a ground; and
a transimpedance amplifier coupled to an input node coupled to the channel; and
calibration circuitry coupled between the input node and the at least one capacitor, the calibration circuitry to:
modify a capacitance of the at least one capacitor based on each of a plurality of control values;
generate, for each control value, a first digital code for a direct current (DC) swing and a second digital code for an alternating current (AC) swing at the input node; and
determine a final control value of the plurality of control values that minimizes a difference between the first and second digital codes.

20. The circuit of claim 19, wherein the at least one capacitor is programmable by the plurality of control values, and wherein the receiver further comprises:
an inverter coupled to the transimpedance amplifier; and
a positive feedback resistor coupled across the transimpedance amplifier and the inverter.

21. The circuit of claim 19, wherein the calibration circuitry is further to set the capacitance of the at least one capacitor using the final control value and is to be disabled after calibration.

22. The circuit of claim 19, wherein the calibration circuitry comprises:
a peak detector coupled to the input node, the peak detector to variably detect, at different times, a DC voltage and an envelope of an AC voltage;
an analog-to-digital converter (ADC) coupled to the peak detector, the ADC to generate the first digital code based on the detected DC voltage and the second digital code based on the detected envelope of the AC voltage; and
a calibration engine coupled between the ADC and the at least one capacitor, wherein the calibration engine is to:
incrementally modify the capacitance using each control value of the plurality of control values;

determine each difference between the first and second digital codes while using a respective control value of the plurality of control values; and identify the final control value based on the differences between the first and second digital codes for the plurality of control values.

23. The circuit of claim 22, wherein the calibration engine is further to:

determine that the transmitter is inactive and an input of the receiver is reset before reading each first digital code from the ADC; and determine that the transmitter is toggling according to a clock pattern before reading each second digital code from the ADC.

24. The circuit of claim 22, wherein the detected DC voltage is a minimum DC voltage formed by positive and negative feedback resistors of the receiver and a detected low-sided envelope of the AC voltage is a minimum AC voltage, and wherein the peak detector comprises:

a plurality of p-type metal-oxide semiconductor (PMOS) transistors that are source-drain coupled and that have gates coupled together; and a capacitor coupled to an output of a first PMOS transistor, of the plurality of PMOS transistors, that is coupled to ground, wherein a current of the peak detector is asymmetrically modulated by an input voltage to the plurality of PMOS transistors so that the peak detector functions as a single-direction rectifier biased towards the minimum DC voltage.

25. The circuit of claim 22, wherein the detected DC voltage is a maximum DC voltage formed by positive and negative feedback resistors of the receiver and a detected high-sided envelope of the AC voltage is a maximum AC voltage, and wherein the peak detector comprises:

a plurality of n-type metal-oxide semiconductor (NMOS) transistors that are source-drain coupled and that have gates coupled together; and a capacitor coupled to an output of a first NMOS transistor, of the plurality of NMOS transistors, that is coupled to a supply voltage, wherein a current of the peak detector is modulated by an input voltage to the plurality of NMOS transistors so that the peak detector functions as a single-direction rectifier biased towards the maximum DC voltage.

26. The circuit of claim 19, further comprising:

an inverter coupled to the transimpedance amplifier;

a positive feedback resistor coupled across the transimpedance amplifier and the inverter; and a deserializer coupled to an output of the inverter and to sample, using a local asynchronous clock, an output signal of the inverter to determine a number of one values and zero values;

wherein the calibration circuitry is further to:

retrieve, from the deserializer, the number of one values and zero values;

determine a duty cycle based on the number of one values compared to the number of zero values; and inject, at the input node, a DC offset voltage to shift an input common mode voltage to bring the duty cycle towards 50%.

27. The circuit of claim 19, wherein the transimpedance amplifier has a negative feedback resistor coupled to the input node, further comprising:

an inverter coupled to the transimpedance amplifier;

a positive feedback resistor coupled across the transimpedance amplifier and the inverter;

wherein the calibration circuitry further comprises:

a low-pass filter (LPF) coupled to the inverter to extract an output common mode voltage of the transimpedance amplifier; and a comparator coupled to the LPF, the comparator to compare the output common mode voltage to a reference voltage; and wherein the calibration circuitry is further to adjust relative strengths of PMOS and NMOS transistors of the transimpedance amplifier and the inverter to skew rising or falling edges of the output common mode voltage towards those of the reference voltage.

* * * * *